United States Patent
Kao et al.

(10) Patent No.: US 11,895,811 B2
(45) Date of Patent: Feb. 6, 2024

(54) CURVED ELECTRONIC DEVICE AND METHOD FOR MANUFACTURING THE SAME

(71) Applicants: Interface Technology (ChengDu) Co., Ltd., Sichuan (CN); Interface Optoelectronics (ShenZhen) Co., Ltd., Guangdong (CN); Interface Optoelectronics (Wuxi) Co., Ltd., Jiangsu (CN); General Interface Solution Limited, Miaoli County (TW)

(72) Inventors: Ping-Hsiang Kao, Miaoli County (TW); Wen-You Lai, Miaoli County (TW); Po-Lun Chen, Miaoli County (TW); Chun-Ta Chen, Miaoli County (TW); Po-Ching Lin, Miaoli County (TW); Ya-Chu Hsu, Miaoli County (TW)

(73) Assignees: INTERFACE TECHNOLOGY (CHENGDU) CO., LTD., Sichuan (CN); INTERFACE OPTOELECTRONICS (SHENZHEN) CO., LTD., Guangdong (CN); INTERFACE OPTOELECTRONICS (WUXI) CO., LTD., Jiangsu (CN); GENERAL INTERFACE SOLUTION LIMITED, Miaoli County (TW)

( * ) Notice: Subject to any disclaimer, the term of this patent is extended or adjusted under 35 U.S.C. 154(b) by 338 days.

(21) Appl. No.: 17/519,153

(22) Filed: Nov. 4, 2021

(65) Prior Publication Data
US 2023/0114927 A1   Apr. 13, 2023

(30) Foreign Application Priority Data
Oct. 8, 2021 (CN) .......................... 202111171989.9

(51) Int. Cl.
*G06F 1/16* (2006.01)
*H05K 5/00* (2006.01)
(Continued)

(52) U.S. Cl.
CPC .......... *H05K 7/20963* (2013.01); *G09F 9/301* (2013.01); *G06F 3/0412* (2013.01); *G06F 3/04164* (2019.05); *G06F 2203/04102* (2013.01)

(58) Field of Classification Search
CPC . H05K 7/20963; G09F 9/301; G06F 3/04164; G06F 3/0415
See application file for complete search history.

(56) References Cited

U.S. PATENT DOCUMENTS

| | | | |
|---|---|---|---|
| 2015/0282327 A1* | 10/2015 | Otsubo | .................... H05K 3/36 29/829 |
| 2022/0256722 A1* | 8/2022 | Chang | ................. H01L 25/0652 |

(Continued)

*Primary Examiner* — Anthony M Haughton
(74) *Attorney, Agent, or Firm* — Locke Lord LLP; Tim Tingkang Xia, Esq.

(57) ABSTRACT

A curved electronic device and a method for manufacturing the same are disclosed. The curved electronic device includes a substrate, a component layer, and a modulation layer. The component layer is disposed on the substrate. The component layer is composed of a plurality of electronic components and their connecting wiring arranged on the substrate. The modulation layer is disposed on the component layer, and includes at least one pattern area and at least one blank area that are formed on the component layer. The blank area allows one part of the electronic components to be exposed out of the modulation layer. The modulation layer and the substrate have different heat absorption rates, so that the positions of the substrate corresponding to the blank area and the pattern area have different degrees of softening, so as to prevent the component layer from being damaged in the process of stretching the substrate.

14 Claims, 10 Drawing Sheets

(51) Int. Cl.
H05K 7/00 (2006.01)
H05K 7/20 (2006.01)
G09F 9/30 (2006.01)
G06F 3/041 (2006.01)

(56) References Cited

U.S. PATENT DOCUMENTS

| | | | |
|---|---|---|---|
| 2022/0367370 A1* | 11/2022 | Chi | H01L 23/552 |
| 2023/0114927 A1* | 4/2023 | Kao | H01L 25/0753 |
| | | | 361/688 |
| 2023/0316984 A1* | 10/2023 | Lius | G06V 40/13 |
| | | | 345/173 |

* cited by examiner

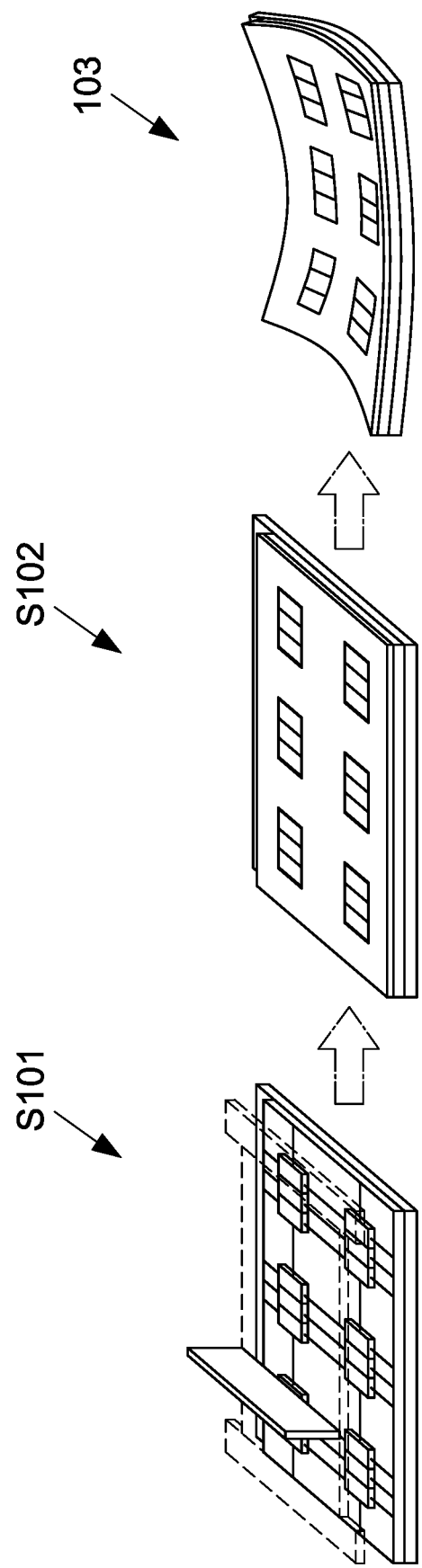

CURVED ELECTRONIC DEVICE AND METHOD FOR MANUFACTURING THE SAME

REFERENCE TO RELATED APPLICATIONS

The present application is based on, and claims priority from, China application number 202111171989.9, filed Oct. 8, 2021, the disclosure of which is hereby incorporated by reference herein in its entirety.

FIELD OF THE INVENTION

The present invention relates to an electronic device, and more particularly to a curved electronic device and a method for manufacturing the same.

BACKGROUND OF THE INVENTION

With the development of image display technology and touch technology widely used in various electronic products, electronic products generally adopt visual touch operation methods. Therefore, touch displays are generally applied to electronic products.

Displays are gradually developed from flat displays to curved displays, such as curved displays or curved touch displays. Many automobile manufacturers develop touch displays instead of physical buttons and knobs, allowing drivers to touch the touch display for performing various functions. When the driver is driving the vehicle, he/she can operate the various functions displayed on the touch display next to the driver's seat. In order to match the curved shape of the interior of the car, a segmented curved display has been developed.

In order to achieve the special shape required by the application end, it needs to be realized with molding technology, such as injection molding, hot press molding, thermoplastic molding . . . etc. Wherein, the thermoforming technology is more suitable to be applied to curved display with wires or electronic components. As to the thermoforming technology, in order to achieve the required curve shape, it is necessary for the substrate to be made of thermoplastic materials (hereinafter referred to as thermoplastic substrate). Referring to FIG. 1, the thermoplastic substrate carries electronic components and the connecting wiring of the electronic components. Referring to FIG. 1 and FIG. 2, in the molding process of the thermoplastic substrate, the thermoplastic substrate 1 is generally placed in a mold 2 for heating, so that the thermoplastic substrate 1 is heated to an appropriate softening temperature. Then, a pressurized gas is poured into the mold 2 to shape the thermoplastic substrate 1 in the mold 2. However, in the molding process of the thermoplastic substrate 1 in the mold 2, the electronic components 10 on the thermoplastic substrate 1 may be damaged or the connecting wiring 12 may be broken and cannot be operated. Especially in the area where the amount of bending deformation of the thermoplastic substrate 1 is greater, the problem of damage to the electronic component 10 or breakage of the connecting wiring 12 is more serious (as shown in FIG. 3).

Since the thermoplastic substrate needs to be made into the corresponding curved shape according to the specifications of the curved display, it is impossible to reduce the amount of bending deformation by adjusting the shape of the thermoplastic substrate. Therefore, the thermoplastic substrate needs a novel structure and manufacturing method to solve the problem of damage to electronic components or breakage of connecting wiring in the bending and deformation of the thermoplastic substrate.

SUMMARY OF THE INVENTION

In view of the defects of the prior art, the primary object of the present invention is to provide a curved electronic device and a method for manufacturing the same. The degree of stretching in different areas of the thermoplastic substrate is adjustable, so as to solve the problem that the electronic components may be damaged and the connecting wiring may break in the bending and deformation process of the thermoplastic substrate.

According to one aspect of the present invention, a curved electronic device is provided. The curved electronic device comprises a substrate, a component layer, and a modulation layer. The component layer is disposed on the substrate. The component layer is composed of a plurality of electronic components and their connecting wiring arranged on the substrate. The modulation layer is disposed on the component layer, and includes at least one pattern area and at least one blank area that are formed on the component layer. The blank area allows one part of the electronic components to be exposed out of the modulation layer. The modulation layer and the substrate have different heat absorption rates, so that the substrate corresponding to the blank area and the pattern area has different degrees of softening. This can prevent the electronic components or the connecting wiring of the component layer from being damaged in the plastic deformation process of the substrate.

Preferably, the electronic components are light-emitting components or touch light-emitting components. Furthermore, the light-emitting components are light-emitting diodes, mini light-emitting diodes (Mini LED), micro light-emitting diodes (Micro LED) or organic light-emitting diodes (OLED) or quantum dot light-emitting diodes.

Preferably, when the electronic components are light-emitting components, the connecting wiring enables the light-emitting components to be connected to the outside. Alternatively, when the electronic components are touch light-emitting components, the touch light-emitting components includes light-emitting components and their corresponding touch wiring, and the connecting wiring enables the light-emitting component and the touch wiring to be connected to the outside.

Preferably, the substrate is an electronic component carrying film, or the substrate is a flexible laminate of an electronic component carrying film and a flexible film.

Preferably, the flexible film is made of polycarbonate (PC), polymethyl methacrylate (PMMA), polyethylene terephthalate (PET), cycloolefin polymer (COP), or a combination thereof.

Preferably, the electronic component carrying film is made of a thermosplastic material, such as polyethylene terephthalate (PET), polyethylene naphthalate (PEN), polyimide (PI), liquid crystal polymer material (LCP), or a combination thereof.

Preferably, the modulation layer is an endothermic material. The endothermic material is an endothermic mixture of a metal material, ceramic material or high polymer material and a colored material.

Preferably, the metal material may be iron, nickel, chromium, titanium, aluminum, or copper.

Preferably, the ceramic material may be silica or alumina.

Preferably, the high polymer material may be acrylic, epoxy, or silicon resin.

Preferably, the colored material may be carbon black powder, graphite powder, iron black powder, iron red powder or chrome green powder.

Preferably, the heat absorption rate of the modulation layer to infrared radiant heat energy is 0.1 to 0.95.

Preferably, the wavelength of infrared radiation is between 750 nanometers (nm) and 1 millimeter (mm), and further is between 750 nanometers (nm) and 1400 nanometers (nm).

Preferably, the positions of the substrate corresponding to the pattern areas have different heat absorption rates higher than that of the substrate according to the degree of thermoplastic bending of the substrate.

According to another aspect of the present invention, a method for manufacturing a curved electronic device is provided. The method comprises the steps of: providing a component layer on a substrate, wherein the component layer is composed of a plurality of electronic components and their connecting wiring arranged on the substrate; providing a modulation layer on the component layer, the modulation layer including at least one pattern area and at least one blank area that are formed on the component layer, the substrate, the component layer and the modulation layer constituting a semi-finished product, wherein the position of the blank area corresponds to at least one part of the electronic components, and the pattern area covers all the positions of the component layer except the blank area; placing the semi-finished product in a thermoforming mold for performing a thermoforming process, wherein in the thermoforming process, according to the difference in the heat absorption rate of the pattern area and the blank area, the degree of softening of the substrate corresponding to the pattern area and the blank area is different.

Preferably, the modulation layer is formed on the component layer by a screen printing, inkjet, yellow light lithography, laser or press printing process.

Preferably, the modulation layer is formed by endothermic materials having different heat absorption rates higher than that of the substrate respectively arranged on pattern areas with different bending degrees, so that the substrate has different stretching degrees due to the difference in the heat absorption rates of the respective different pattern areas.

According to the foregoing, the substrate of the present invention adjusts the heat absorption rate through the modulation layer, so that after the substrate is heated in the mold, the amount of heat absorbed by the position of the substrate corresponding to the pattern area is different from that of the position of the substrate corresponding to the blank area, so that the position of the substrate corresponding to the pattern area and the position of the substrate corresponding to the blank area have different stretching changes, thereby solving the problem of damage to the component layer.

BRIEF DESCRIPTION OF THE DRAWINGS

FIG. 10 is a flow chart showing the method for manufacturing the curved electronic device of the present invention.

DETAILED DESCRIPTION OF THE PREFERRED EMBODIMENTS

Embodiments of the present invention will now be described, by way of example only, with reference to the accompanying drawings.

Figure 1:
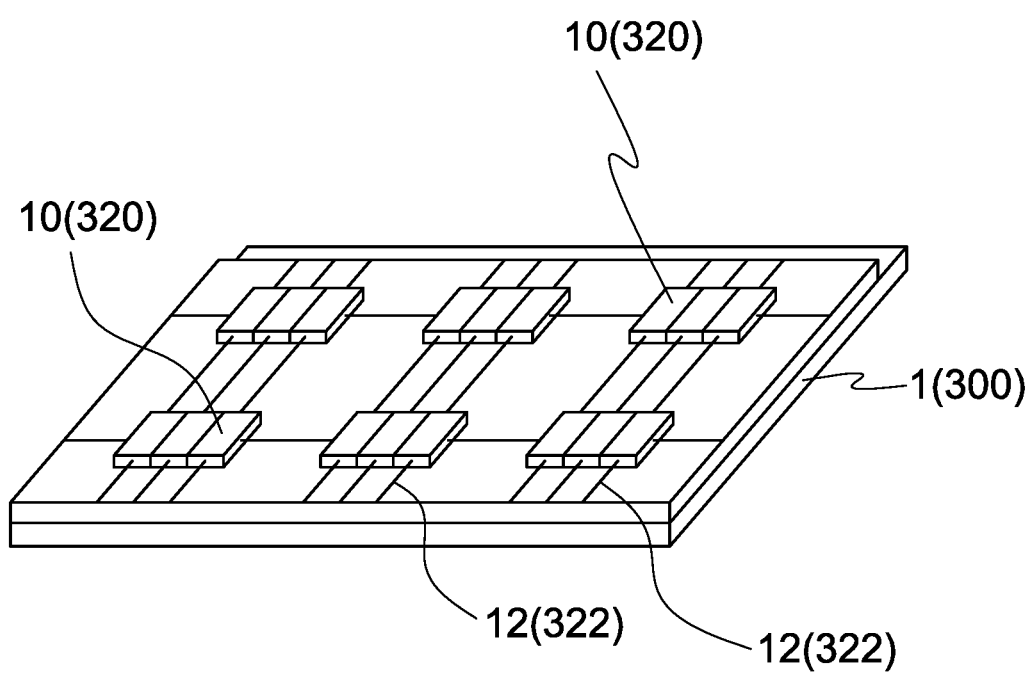
FIG. 1 is a schematic view of electronic components and their connecting wiring carried on a substrate.
Figure 2:
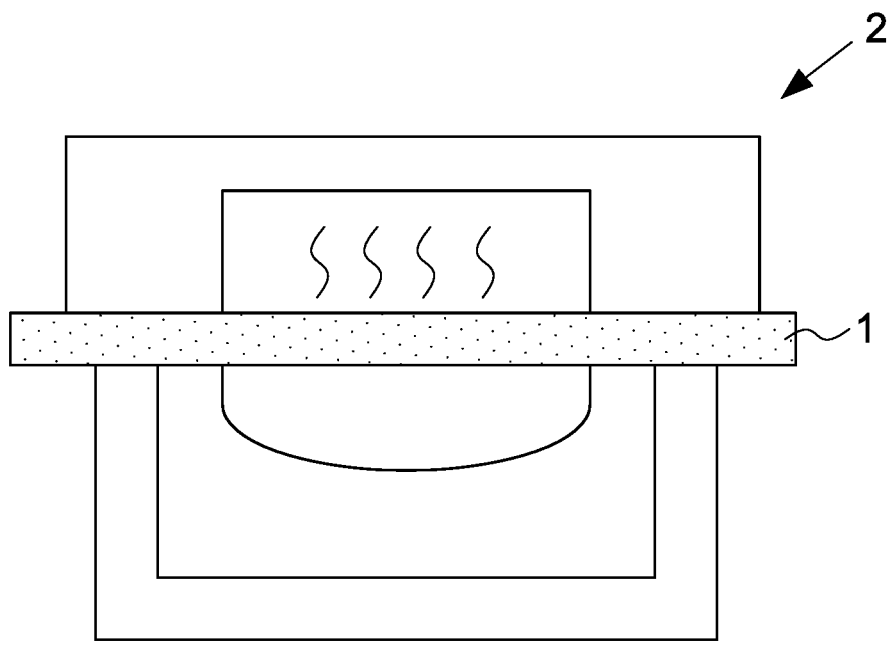
FIG. 2 is a schematic view of the heating and shaping of a conventional thermoplastic substrate in a mold.
Figure 2:
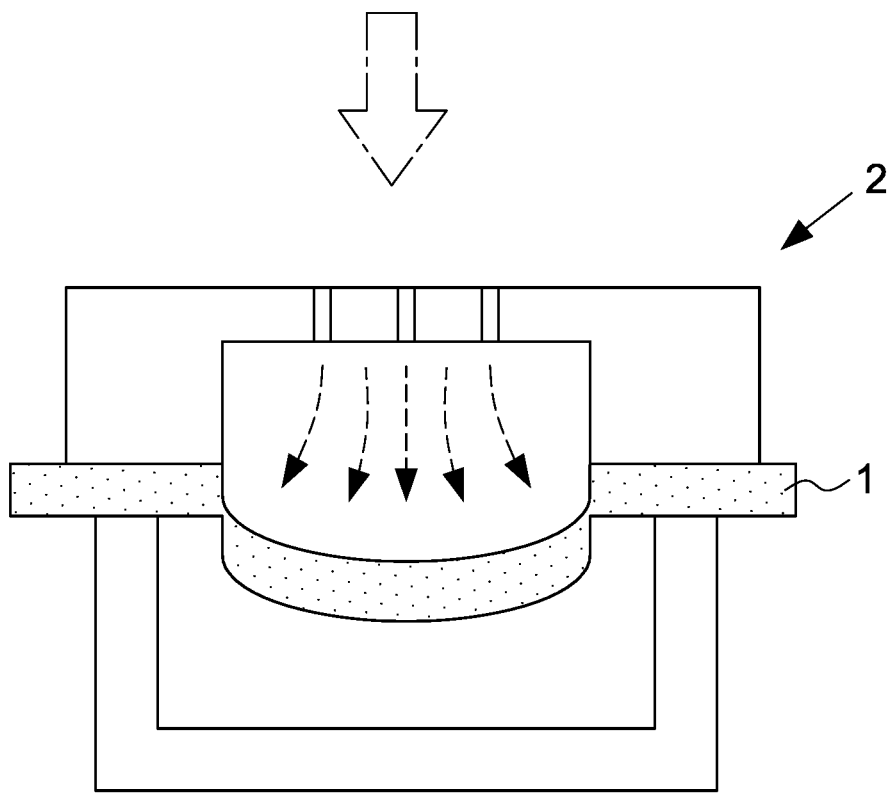
Figure 3:
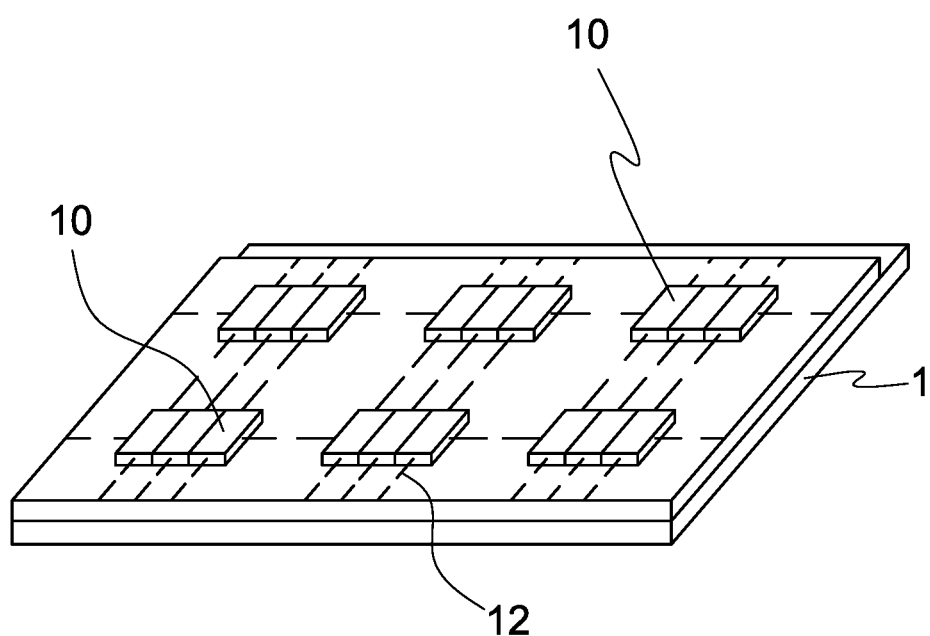
FIG. 3 is a schematic view showing the fracture of the connecting wiring of the conventional thermoplastic substrate after being shaped.
Figure 4:
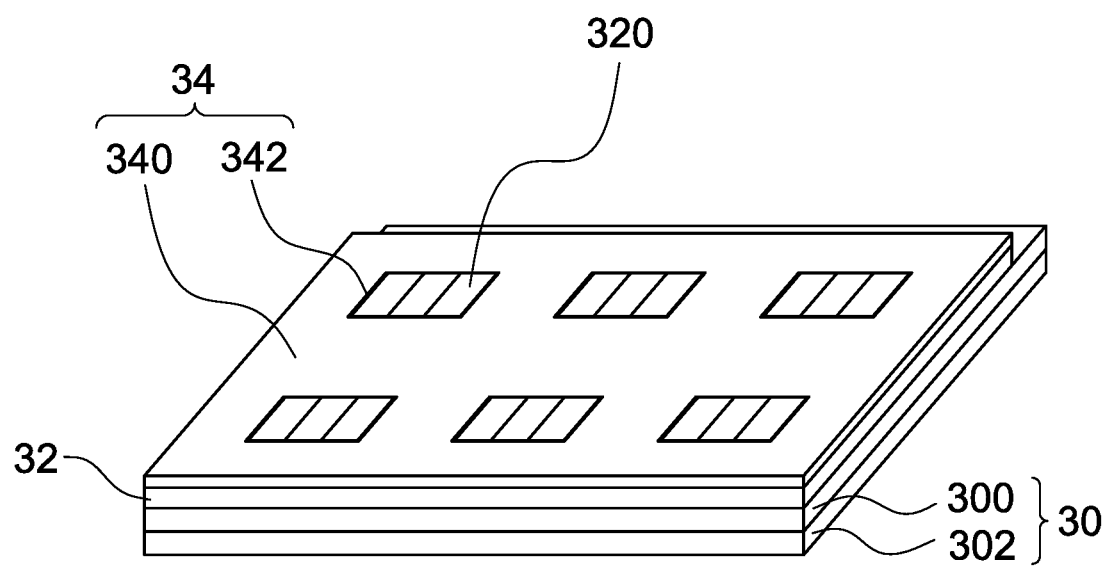
FIG. 4 is a perspective view of the curved electronic device of the present invention.
Figure 5:
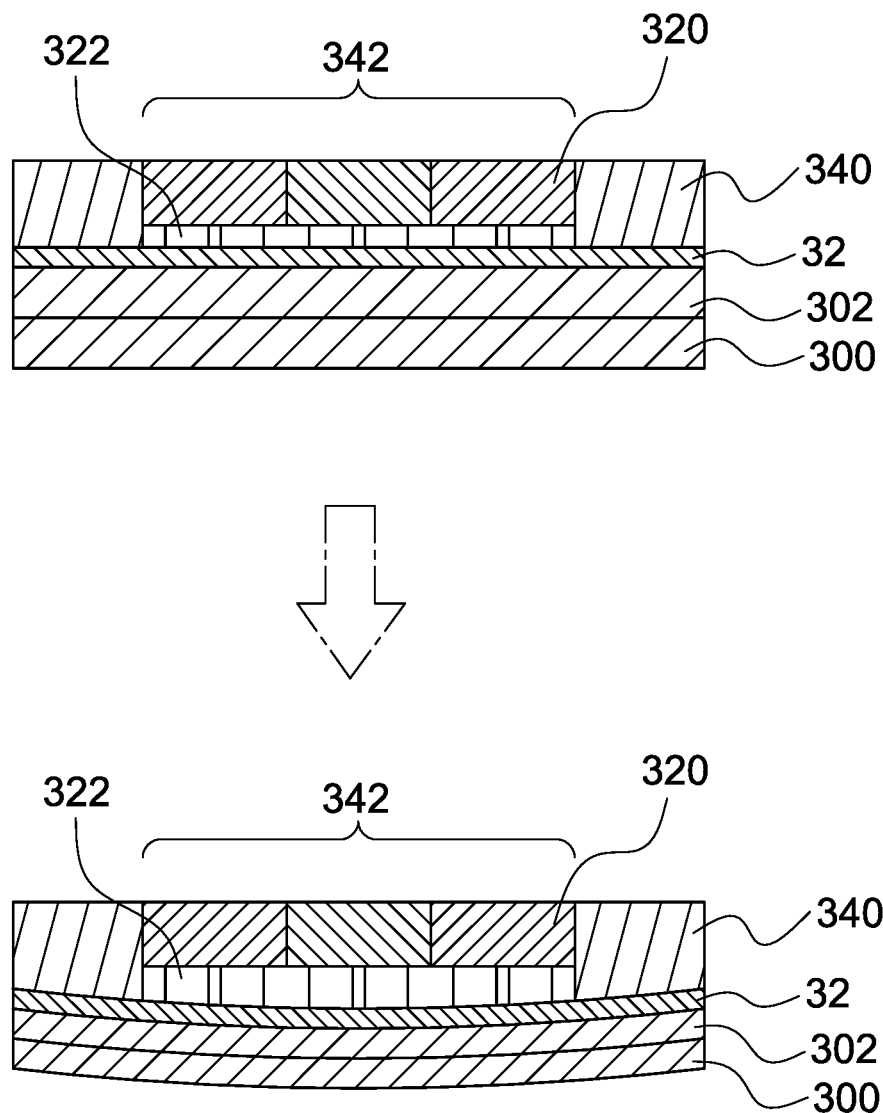
FIG. 5 is a cross-sectional view of the curved electronic device of the present invention before being shaped and after being shaped.
Figure 6:
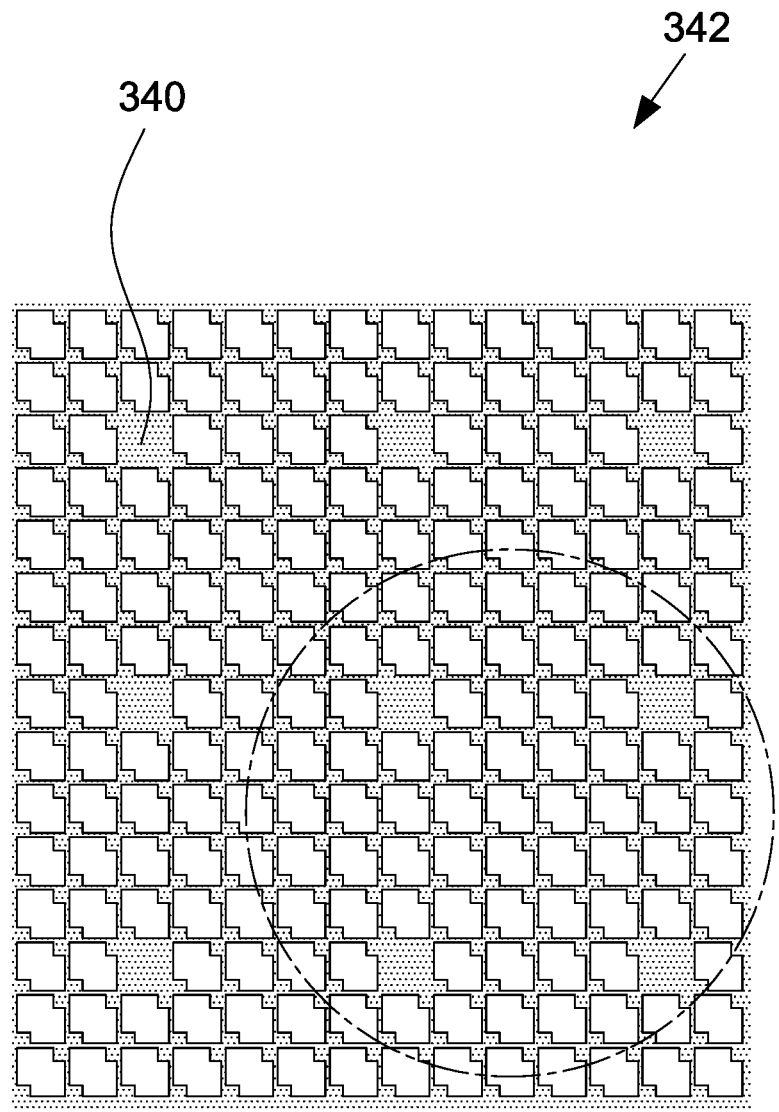
FIG. 6 is a schematic view of the pattern area and the blank area of the substrate of the present invention before being shaped.

Referring to FIG. 4 and FIG. 5, the present invention discloses a curved electronic device, comprising a substrate 30, a component layer 32 and a modulation layer 34. The component layer 32 is disposed on the substrate 30. The component layer 32 is composed of a plurality of electronic components 320 and their connecting wiring 322 arranged on the substrate 30. The modulation layer 34 is disposed on the component layer 32 and includes at least one pattern area 340 and at least one blank area 342 that are formed on the component layer 32. The blank area 342 allows one part of the electronic components 320 to be exposed out of the modulation layer 34. The positions of the substrate 30 corresponding to the pattern area 340 and the blank area 342 have different heat absorption rates, so that the positions of the substrate 30 corresponding to the pattern area 340 and the blank area 342 generate different amounts of deformation in the plastic deformation process (as shown in FIG. 6).

In the present invention, the reason why the substrate 30 generates different amounts of deformation in the plastic deformation process is that the positions of the substrate 30 corresponding to the pattern area 340 and the blank area 342 have different heat absorption rates, so that the positions of the substrate 30 corresponding to the pattern area 340 and the blank area 342 have different degrees of softening under the same heating conditions, respectively. Because the positions of the substrate 30 corresponding to the pattern area 340 and the blank area 342 have different degrees of softening, under the same or similar deformed shape in the thermoplastic mold, the tensile deformation of the position of the substrate 30 corresponding to the pattern area 340 is greater than the tensile deformation of the position of the substrate 30 corresponding to the blank area 342.

In an exemplary embodiment of the present invention, the curved electronic device is a curved display. The electronic components 320 are light-emitting components or touch light-emitting components. Furthermore, the light-emitting components are light-emitting diodes, mini light-emitting diodes (Mini LED), micro light-emitting diodes (Micro LED) or organic light-emitting diodes (OLED).

In this exemplary embodiment, the connecting wiring 322 enables the light-emitting components to be connected to the outside, or the connecting wiring 322 enables the light-emitting components and the touch wiring of the touch light-emitting components to be connected to the outside.

In this exemplary embodiment, the substrate 30 is an electronic component carrying film 300, or the substrate 30 is a flexible laminate of an electronic component carrying film 300 and a flexible film 302. The flexible film 302 is made of polycarbonate (PC), polymethyl methacrylate (PMMA), polyethylene terephthalate (PET), cycloolefin polymer (COP), or a combination thereof. The electronic component carrying film 300 is made of a thermoplastic material, such as polyethylene terephthalate (PET), polyethylene naphthalate (PEN), polyimide (PI), liquid crystal polymer material (LCP), or a combination thereof.

For the substrate 30 in the mold to be under the same endothermic conditions, the substrate 30 has different degrees of stretching for the electronic components 320 and the connecting wiring 322 on the corresponding component layer 32, so as to prevent the electronic components 320 and the connecting wiring 322 from being damaged in the stretching process. In this exemplary embodiment, the modulation layer 34 is an endothermic material. The endothermic material is an endothermic mixture of a metal material, ceramic material or high polymer material and a colored material. The metal material may be iron, nickel, chromium, titanium, aluminum, or copper. The ceramic material may be silica or alumina. The high polymer material may be acrylic, epoxy, or silicon resin.

In an exemplary embodiment, the colored material may be carbon black powder, graphite powder, or iron black powder (for example, iron oxide black). For a curved display, the pattern area 340 uses the black material with the highest heat absorption rate (such as carbon black, graphite, iron black). The position of the substrate 30 corresponding to the pattern area 340 absorbs more heat than the position of the substrate 30 corresponding to the blank area 342, so that the degree of softening of the position of the substrate 30 corresponding to the pattern area 340 is greater than that of the position of the substrate 30 corresponding to the blank area 342, and the tensile deformation of the position of the substrate 30 corresponding to the pattern area 340 is greater than the tensile deformation of the position of the substrate 30 corresponding to the blank area 342. Besides, the black material can reduce the interference phenomenon between the pixels after the light-emitting components are mixed, so as to achieve the effect of the stability of the CIE color gamut distribution of the light emitted by the light-emitting component of each pixel.

The substrate 30 needs different degrees of softening according to different bending shapes. Therefore, the substrate 30 has different heat absorption rates in accordance with the degree of thermoplastic bending of each pattern area 340. For the substrate 30 to have different heat absorption rates corresponding to the respective pattern areas 340, the pattern areas 340 use different colored materials, or a different amount of black material is added to the endothermic material. Furthermore, the more black material is added, the higher the heat absorption rate of the substrate 30 corresponding to each pattern area 340 will be.

In the present invention, the heat absorption rate of the modulation layer 34 to infrared radiant heat energy is 0.1 to 0.95. The wavelength of infrared radiation is between 750 nanometers (nm) and 1 millimeter (mm), and further is between 750 nanometers (nm) and 1400 nanometers (nm).

Figure 7:
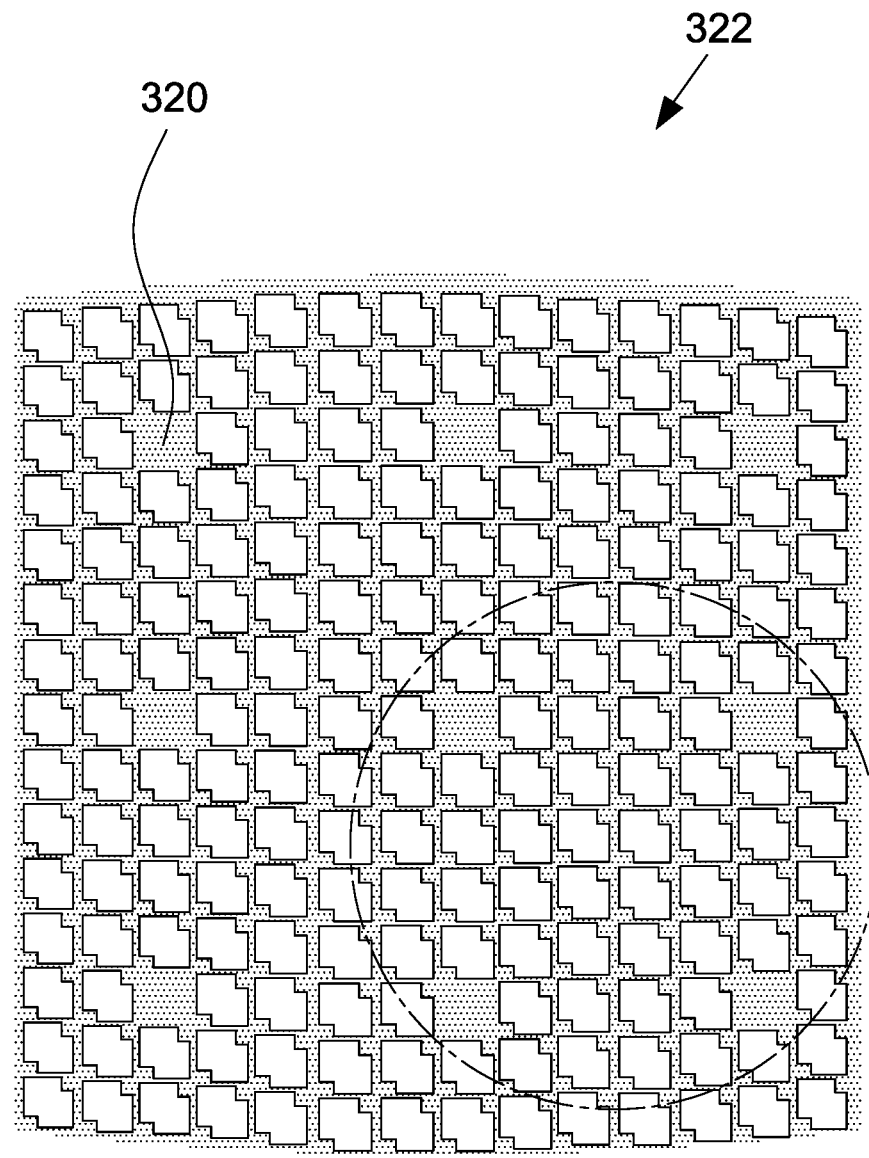
FIG. 7 is a schematic view of the pattern area and the blank area of the substrate of the present invention after being shaped.
Figure 8:
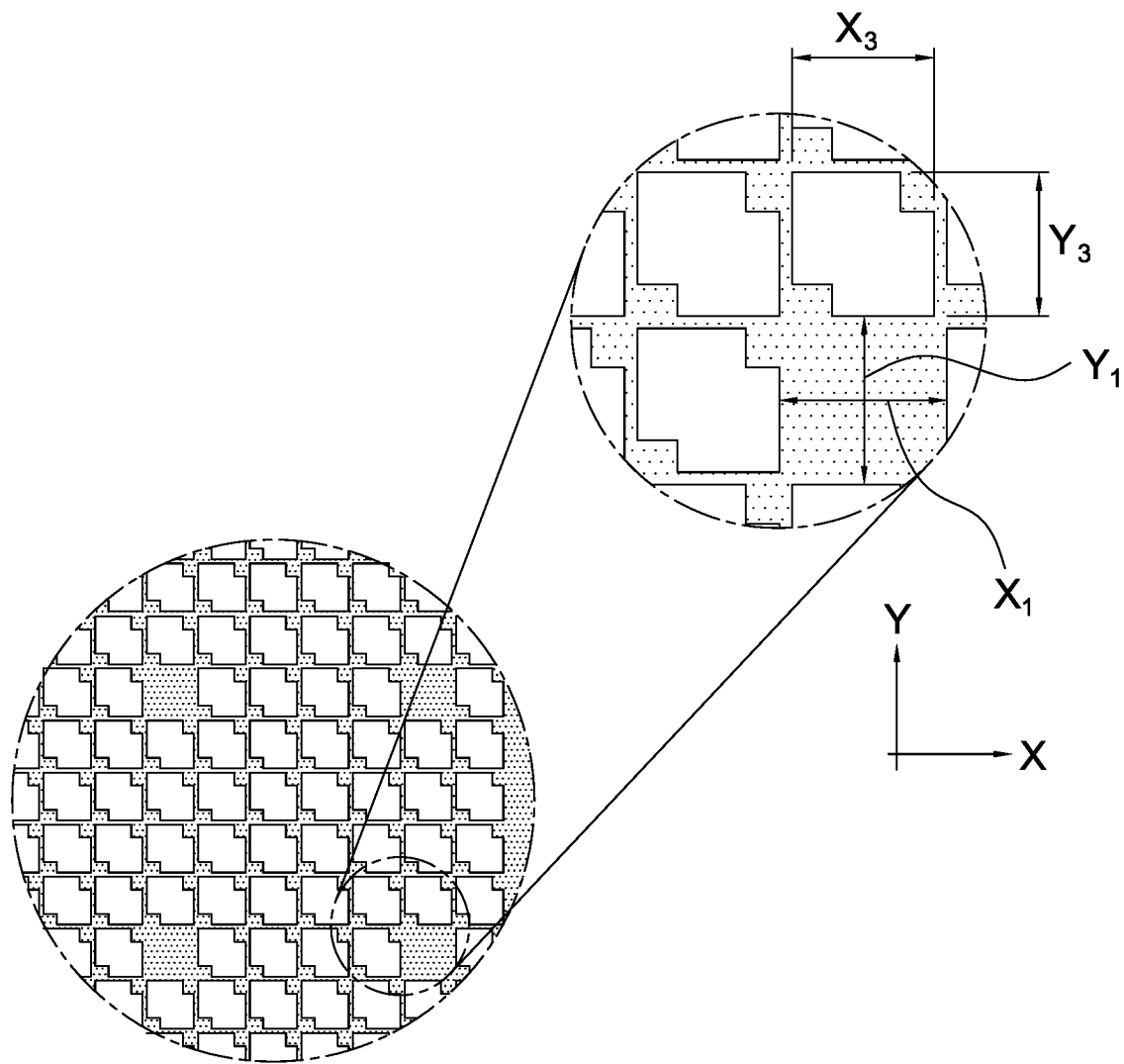
FIG. 8 is an enlarged view of the pattern area and the blank area of FIG. 6.
Figure 9:
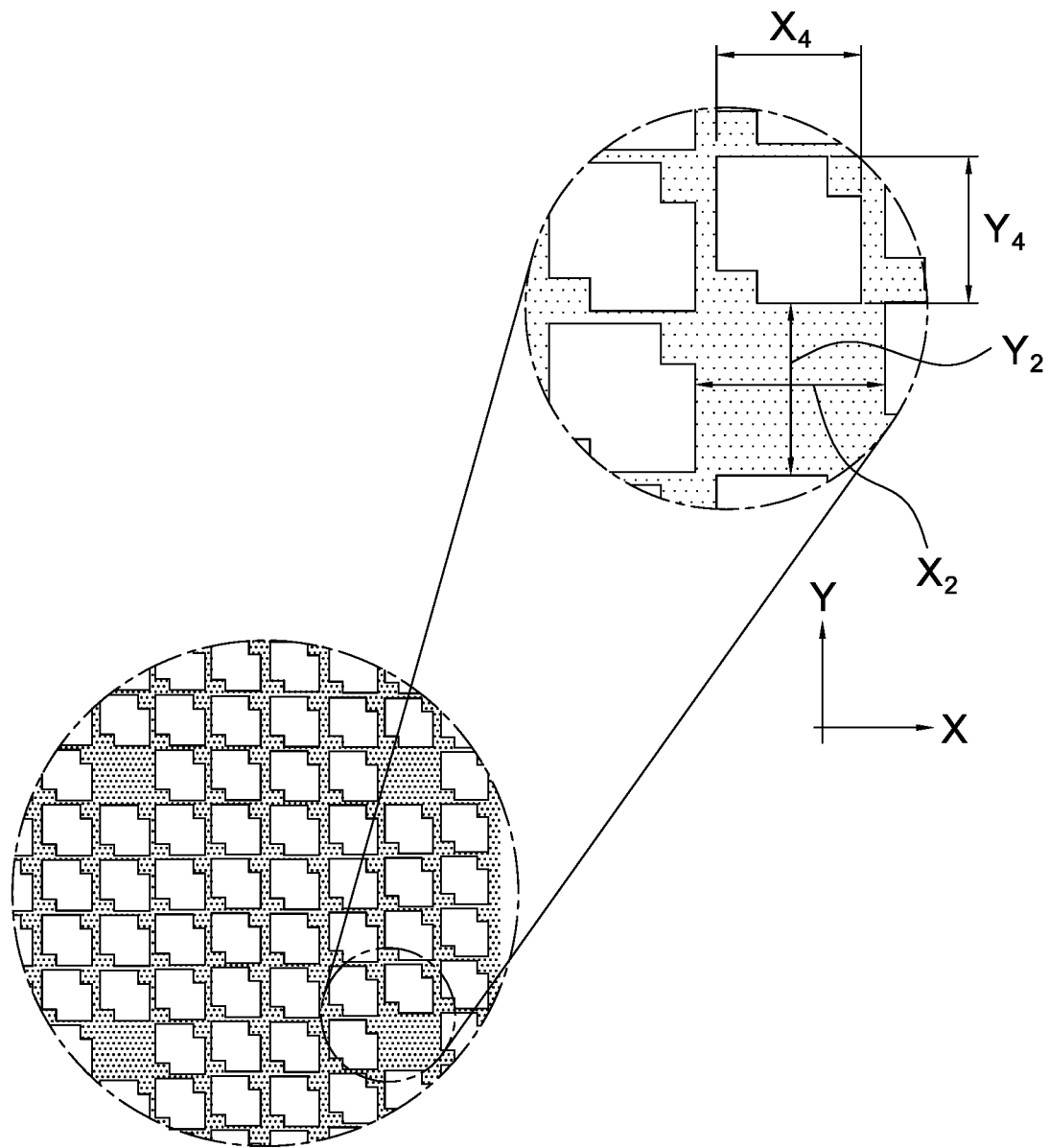
FIG. 9 is an enlarged view of the pattern area and the blank area of FIG. 7.

As shown in FIG. 6, a plurality of soldering pads for connecting the electronic components 320 are provided on the substrate 30, and nine positions of the substrate 30 are provided with the pattern areas 340, and the remaining positions of the substrate 30 are the blank areas 342. After thermoforming, as shown in FIG. 7, the tensile deformation of the pattern areas 340 on the substrate 30 is greater than the tensile deformation of the blank areas 342. Referring to FIG. 8 and FIG. 9, in the X direction of the pattern area 340, compared the width X1 before deformation with the width X2 after deformation, the width X2 after deformation is increased by about 27.32% than the width X1 before deformation. In the Y direction of the pattern area 340, compared the width Y1 before deformation with the width Y2 after deformation, the width Y2 after deformation is increased by about 28.68% than the width Y1 before deformation.

In the X direction of the blank area 342, compared the width X3 before deformation with the width X4 after deformation, the width X4 after deformation is increased by about 23.49% than the width X3 before deformation. In the Y direction of the blank area 342, compared the width Y3 before deformation with the width Y4 after deformation, the width Y4 after deformation is increased by about 21.01% than the width Y3 before deformation.

Furthermore, the area of the pattern area 340 after deformation is about 58.90% greater than the area before deformation. The area of the blank area 342 after deformation is about 54.07% greater than the area before deformation. It can be seen from the foregoing that the amount of deformation of the pattern area 340 is greater than that of the blank area 342. In other words, the amount of stretching of the substrate 30 can be increased by the arrangement of the pattern area 340. The tensile amount of the substrate 30 is increased by the arrangement of the pattern area 340.

In the drawings and related figures of the present invention, the pattern area 340 is configured to increase the heat absorption capacity of the substrate 30, so that the position of the substrate 30 corresponding to the pattern area 340 is softened more than the position of the substrate 30 corresponding to the blank area 342. However, when the present invention is actually implemented, it is not limited to this. The pattern area 340 may be a heat-insulating material (or exothermic material). The pattern area 340 is configured to reduce the heat absorption capacity of the substrate 30, so that the position of the substrate 30 corresponding to the pattern area 340 is softer than the position of the substrate 30 corresponding to the blank area 342.

For the pattern area 340 to absorb heat evenly and faster, in the present invention, the surface of the pattern area 340 is provided with a microstructure, and the microstructure uniformly conducts surface heat to the substrate 30 to increase the heat absorption capacity of the substrate 30 relative to the pattern area 340. Alternatively, the surface of the pattern area 340 is provided with a microstructure, and the microstructure reflects the surface heat to reduce the heat absorption capacity of the position of the substrate 30 relative to the pattern area 340. In other words, in the present invention, the pattern area 340 and the blank area 342 are configured to control the heat absorption efficiency of the corresponding position of the substrate 30, so that the substrate 30 has different heat absorption rates at the positions corresponding to the pattern area 340 and the blank area 342, which is within the scope of the present invention.

In order to make the connecting wiring 322 less likely to break in the stretching and deformation process, the width of the connecting wiring 322 of the present invention may be designed according to the degree of stretching (deformation). The greater the degree of stretching of the connecting wiring 322 is, the greater the width will be. Preferably, the width of the connecting wiring 322 after the stretching is completed tends to be uniform. Alternatively, the shape of the connecting wiring 322 is wavy (or S-shaped), so that in the stretching process of the connecting wiring 322, the connecting wiring 322 has sufficient redundant length to provide deformation and stretching. Even more, the width of the connecting wiring 322 after the stretching is completed tends to be uniform and has no wavy shape.

Referring to FIG. 10, the present invention provides a method for manufacturing a curved electronic device, comprising the following steps:

(S101) providing a component layer 32 on a substrate 30, wherein the component layer 32 is composed of a plurality of electronic components 320 and their connecting wiring 322 arranged on the substrate 30;

(S102) providing a modulation layer 34 on the component layer 32, the modulation layer 34 including at least one pattern area 340 and at least one blank area 342 that are formed on the component layer 32, the substrate 30, the component layer 32 and the modulation layer 34 constituting a semi-finished product, wherein the position of the blank area 342 corresponds to at least one part of the electronic components 320, and the pattern area 340 covers all the positions of the component layer 32 except the blank area 342;

(S103) placing the semi-finished product in a thermoforming mold for performing a thermoforming process, wherein in the thermoforming process, according to the difference in the heat absorption rate of the pattern area 340 and the blank area 342, the degree of stretching of the substrate 30 corresponding to the pattern area 340 and the blank area 342 is different.

In the present invention, the manner in which the modulation layer 34 is formed on the component layer 32 by a screen printing, inkjet, yellow light lithography, laser or press printing process. Furthermore, the modulation layer 34 is formed by endothermic materials having different heat absorption rates higher than that of the substrate 30 respectively arranged on the pattern areas 340 with different bending degrees, so that the substrate 30 has different stretching degrees due to the difference in the heat absorption rates of the respective different pattern areas 340.

To sum up, the substrate 30 of the present invention uses the pattern area 340 and the blank area 342 of the modulation layer 34 to adjust its heat absorption rates, so that the degrees of softening of the pattern area 340 and the blank area 342 are different, so as to solve the problem of the connecting wiring 322 on the component layer 32. In particular, the black material with the highest heat absorption rate is selected for the pattern area 340. In addition to increasing the degree of softening of the substrate 30, the black material can reduce the interference between pixels, so as to achieve the effect of the stability of the CIE color gamut distribution of the light emitted by the light-emitting component of each pixel.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A curved electronic device, comprising:
  a substrate;
  a component layer, disposed on the substrate, the component layer being composed of a plurality of electronic components and their connecting wiring arranged on the substrate; and
  a modulation layer, disposed on the component layer and including at least one pattern area and at least one blank area that are formed on the component layer, wherein the blank area allows one part of the electronic components to be exposed out of the modulation layer, a position of the substrate corresponding to the pattern area and a position of the substrate corresponding to the blank area have different heat absorption rates.

2. The curved electronic device as claimed in claim 1, wherein each of the electronic components is a light-emitting component, and the connecting wiring enables the light-emitting component to be connected to an outside.

3. The curved electronic device as claimed in claim 1, wherein each of the electronic components is a light-emitting component and its corresponding touch wiring, and the connecting wiring enables the light-emitting component and the corresponding touch wiring to be connected to an outside.

4. The curved electronic device as claimed in claim 1, wherein the substrate is an electronic component carrying film.

5. The curved electronic device as claimed in claim 1, wherein the substrate is a flexible laminate of an electronic component carrying film and a flexible film.

6. The curved electronic device as claimed in claim 1, wherein the modulation layer is an endothermic material.

7. The curved electronic device as claimed in claim 1, wherein the position of the substrate corresponding to each pattern area has a different heat absorption rate according to the degree of thermoplastic bending of the substrate.

8. The curved electronic device as claimed in claim 1, wherein a surface of the pattern area is provided with a microstructure, and the microstructure uniformly conducts surface heat to the substrate to increase heat absorption capacity of the substrate relative to the pattern area.

9. The curved electronic device as claimed in claim 1, wherein a surface of the pattern area is provided with a microstructure, and the microstructure reflects surface heat to reduce heat absorption capacity of the position of the substrate relative to the pattern area.

10. A method for manufacturing a curved electronic device, comprising the steps of:
  providing a component layer on a substrate, wherein the component layer is composed of a plurality of electronic components and their connecting wiring arranged on the substrate;
  providing a modulation layer on the component layer, the modulation layer including at least one pattern area and at least one blank area that are formed on the component layer, the substrate, the component layer and the modulation layer constituting a semi-finished product, wherein the position of the blank area corresponds to at least one part of the electronic components, and the pattern area covers all the positions of the component layer except the blank area;
  placing the semi-finished product in a thermoforming mold for performing a thermoforming process, wherein in the thermoforming process, according to the difference in the heat absorption rate of the pattern area and the blank area, the degree of stretching of the substrate corresponding to the pattern area and the blank area is different.

11. The method as claimed in claim 10, wherein the modulation layer is formed on the component layer by a screen printing, inkjet, yellow light lithography, laser or press printing process.

12. The method as claimed in claim 11, wherein the modulation layer is formed by endothermic materials having different heat absorption rates higher than that of the substrate respectively arranged on pattern areas with different bending degrees, so that the substrate has different stretching degrees due to the difference in the heat absorption rates of the respective different pattern areas.

13. The method as claimed in claim 10, wherein the modulation layer is formed on the component layer by a screen printing, inkjet, yellow light lithography, laser or press printing process, a surface of the pattern area is provided with a microstructure, and the microstructure uniformly conducts surface heat to the substrate to increase heat absorption capacity of the substrate relative to the pattern area.

14. The method as claimed in claim 10, wherein the modulation layer is formed on the component layer by a screen printing, inkjet, yellow light lithography, laser or press printing process, a surface of the pattern area is provided with a microstructure, and the microstructure reflects surface heat to reduce heat absorption capacity of the position of the substrate relative to the pattern area.

* * * * *